(12) United States Patent
Chang et al.

(10) Patent No.: US 8,981,478 B2
(45) Date of Patent: Mar. 17, 2015

(54) RECESSED SOURCE AND DRAIN REGIONS FOR FINFETS

(75) Inventors: Josephine B. Chang, Mahopac, NY (US); Paul Chang, Bedford Hills, NY (US); Michael A. Guillorn, Yorktown Heights, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/611,335

(22) Filed: Sep. 12, 2012

(65) Prior Publication Data

US 2013/0175624 A1    Jul. 11, 2013

Related U.S. Application Data

(63) Continuation of application No. 13/348,188, filed on Jan. 11, 2012, now Pat. No. 8,557,648.

(51) Int. Cl.
*H01L 29/78* (2006.01)

(52) U.S. Cl.
USPC .................................. 257/347; 257/E29.255

(58) Field of Classification Search
USPC ........... 257/382, 288, 401, E29.267, E29.299
See application file for complete search history.

(56) References Cited

U.S. PATENT DOCUMENTS

| | | | |
|---|---|---|---|
| 7,148,541 B2 * | 12/2006 | Park et al. ..................... | 257/347 |
| 7,476,578 B1 | 1/2009 | Cheng et al. | |
| 7,615,443 B2 | 11/2009 | Cheng et al. | |
| 2003/0057486 A1 | 3/2003 | Gambino et al. | |
| 2005/0199920 A1 * | 9/2005 | Lee et al. ..................... | 257/288 |
| 2006/0189043 A1 | 8/2006 | Schulz | |
| 2008/0237655 A1 * | 10/2008 | Nakabayashi et al. ........ | 257/255 |
| 2008/0315309 A1 | 12/2008 | Chang et al. | |
| 2011/0121406 A1 * | 5/2011 | Lee et al. ..................... | 257/401 |

OTHER PUBLICATIONS

Collaert et al., "Integration Challenges for Multi-Gate Devices," 2005 IEEE International Conference on Integrated Circuit and Technology, May 2005 pp. 187-194.

Hsiao et al., "Source/Drain Engineering with Ge Large Angle Tilt Implantation and Pre-Amorphization to Improve Current Drive and Alleviate Floating Body Effects of Thin Film SOI MOSFETs," downloaded on Apr. 1, 2011 and available at http://www.imec.be/essderc/papers-97/221.pdf.

Mody et al., "Dopant and Carrier Profiling in FinFET-Based Devices with Sub-Nanometer Resolution," Symposium on VLSI Technology, Jun. 2010, pp. 195-196.

(Continued)

*Primary Examiner* — Roy Potter
*Assistant Examiner* — Paul Patton
(74) *Attorney, Agent, or Firm* — Tutunjian & Bitetto, P.C.; Vazken Alexanian

(57) ABSTRACT

Semiconductor devices and methods that include forming a fin field effect transistor by defining a fin hardmask on a semiconductor layer, forming a dummy structure over the fin hardmask to establish a planar area on the semiconductor layer, removing a portion of the fin hardmask that extends beyond the dummy structure, etching a semiconductor layer adjacent to the dummy structure to produce recessed source and drain regions, removing the dummy structure, etching the semiconductor layer in the planar area to produce fins, and forming a gate stack over the fins.

18 Claims, 4 Drawing Sheets

(56) References Cited

OTHER PUBLICATIONS

Momiyama et al., "Indium Tilted Channel Implantation Technology for 60 nm nMOSFET," Symposium on VLSI Technology Digest of Technical Papers, Jun. 1999, pp. 67-68.

Yeh et al., "Optimum Halo Structure for Sub-0.1um CMOSFETs," IEEE Transactions on Electron Devices, vol. 48, No. 10, Oct. 2001, pp. 2357-2362.

* cited by examiner

US 8,981,478 B2

RECESSED SOURCE AND DRAIN REGIONS FOR FINFETS

RELATED APPLICATION DATA

This application is a Continuation application of co-pending U.S. patent application Ser. No. 13/348,188 filed on Jan. 11, 2012, incorporated herein by reference in its entirety.

BACKGROUND

1. Technical Field

The present invention relates to transistor design and, and more particularly, to the design of fin field effect transistors having recessed source and drain regions.

2. Description of the Related Art

In conventional fin field effect transistors (FinFETs), source and drain regions are formed with a top surface that is flush with, or raised with respect to, a semiconductor fin. This leads to external resistance which degrades the performance of the FinFET. Furthermore, a flush or raised design frequently needs a high-energy implant process for doping. High-energy implants can damage and cause vacancies in the substrate, resulting a lower-than-optimal external resistance.

SUMMARY

A method for forming a fin field effect transistor is shown that includes defining a fin hardmask on a semiconductor layer, forming a dummy structure over the fin hardmask to establish a planar area on the semiconductor layer, removing a portion of the fin hardmask that extends beyond the dummy structure, etching a semiconductor layer adjacent to the dummy structure to produce recessed source and drain regions, removing the dummy structure, etching the semiconductor layer in the planar area to produce fins, and forming a gate stack over the fins.

A method for forming a fin field effect transistor is shown that includes defining a fin hardmask on a semiconductor layer, forming a dummy structure over the fin hardmask to establish a planar area on the semiconductor layer, removing a portion of the fin hardmask that extends beyond the dummy structure, etching a semiconductor layer adjacent to the dummy structure with a timed reactive ion etch to produce recessed source and drain regions, forming a conducting layer on the recessed source and drain regions by forming a metal layer on the recessed source and drain regions and annealing the metal layer to form a silicide, removing the dummy structure, etching the semiconductor layer in the planar area to produce fins at the fin hardmask, and forming a gate stack over the fins.

A transistor device is shown that includes one or more fins of channel material connecting a source region and a drain region, wherein the source region and the drain region include a vertical surface and a horizontal surface that is recessed with respect to a top surface of the fins, and a gate conductor formed over and between the one or more fins.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
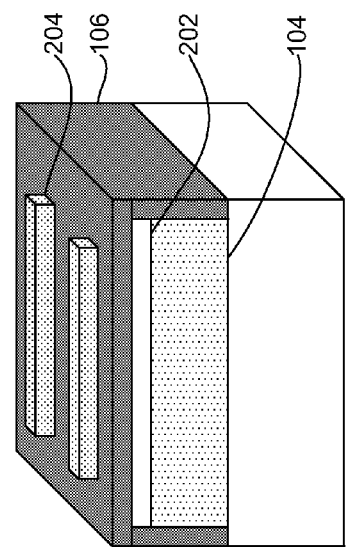
FIG. 1 is a perspective view of a first stage in creating a fin field effect transistor (FinFET) having recessed source and drain regions.

The present principles provide semiconductor devices and methods for fabrication that permit formation of recessed source and drain regions for fin field effect transistors (FinFETs). In a particularly useful embodiment, the recessed source/drain regions may be recessed relative to a fin. A conducting liner (which may include, for example, a silicide) can be formed closer to a base of the fin. This structure decreases the amount of spreading resistance. Furthermore, recessed source and drain regions permit immediate access to regions of semiconductor material in close proximity with the junction itself, permitting lower energy implant processes such as, for example, plasma doping (e.g., using Arsenic or Boron processes) at energies of less than about 1 keV. Low energy implants create less damage and fewer vacancies in the materials when they are implanted, resulting in lower external resistance. A lower energy implant also provides a steeper junction profile, which reduces spreading resistance from the channel to the source/drain junctions. These improvements, among others, increase the efficiency of the FinFET.

It is to be understood that the present invention will be described in terms of a given illustrative architecture having a wafer; however, other architectures, structures, substrate materials and process features and steps may be varied within the scope of the present invention.

It will also be understood that when an element, such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of semiconductor devices may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, the formation of a semiconductor-on-insulator (SOI) structure 100 is illustratively shown. Although silicon is discussed herein for an exemplary embodiment, it is contemplated that the SOI structure 100 may be formed using other appropriate materials including, e.g., non-silicon semiconductor materials such as germanium. A dielectric layer 102 is formed from a dielectric layer on a substrate 101. It should be understood that substrate 101 may include a bulk substrate or semiconductor on insulator substrate. While substrate 102 preferably includes silicon, other materials may be employed, such as SiGe, Ge, GaAs, etc. The substrate 101 is shown here for completeness, but is omitted from subsequent diagrams to simplify depiction.

The dielectric layer 102 may be, for example, a buried oxide (BOX) material, such as silicon dioxide or any other appropriate material. A layer 104 is formed on top of the dielectric layer 102. Layer 104 may be formed from, e.g., silicon, and may be formed or attached through any suitable process. Trenches 106 are formed in layer 104. The trenches 106 may be formed using shallow trench isolation techniques and filled with a liner 106 to protect the dielectric layer 102. The liner 106 may be formed from, e.g., a silicon nitride such as $Si_3Ni_4$.

Figure 2:
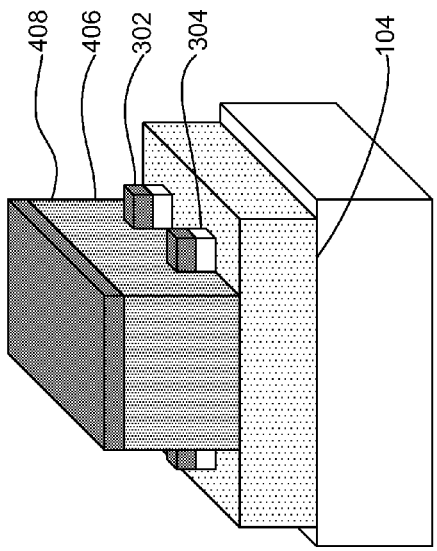
FIG. 2 is a perspective view of a fin patterning stage in creating a FinFET having recessed source and drain regions.

Referring now to FIG. 2, the patterning of fins is illustratively shown. A layer of dielectric 202, e.g., an oxide, is formed on the semiconductor layer 104. The dielectric layer 202 may be formed from, e.g., silicon dioxide. The liner 106 is extended to cover the dielectric layer 202. Layer 104 may have an exemplary thickness of around 26 nm. The dielectric layer 202 may have an exemplary thickness of around 20 nm. The liner 106 may have an exemplary thickness of around 20 nm. These thicknesses are provided for the sake of illustration—it is contemplated that other appropriate thicknesses may be employed. Fin patterns 204 are established on the liner 106 by patterning a resist, such as, e.g., hydrogen silsesquioxane (HSQ). Fin patterns 204 may have a width of, e.g., about 10 nm to about 20 nm and may be pitched, e.g., about 40 nm to about 80 nm apart, having a length substantially greater than the width. The fin patterns 204 establish the locations for fins in the finished device and hence should be of an appropriate size to facilitate transistor functioning.

Figure 3:
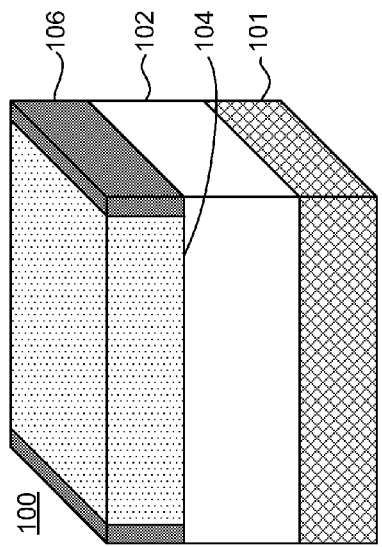
FIG. 3 is a perspective view of a fin hardmask etching stage in creating a FinFET having recessed source and drain regions.

Referring now to FIG. 3, etching is performed to open fin hardmask 302. Etching may be performed with, e.g., reactive ion etching (RIE) that uses a chemically reactive plasma to remove the liner 106 and pattern layer 202 to remove material outside of the area defined by fin pattern 204, thereby exposing layer 104 while forming dielectric fins 304. It is contemplated that other appropriate forms of etching or liner removal may be employed, and that those having ordinary skill in the art will be able to select particular etching gases or plasmas suited to the materials being etched. The fin pattern 204 is removed during etching, leaving a dummy fin pattern formed from dielectric 304 and hardmask 302, each layer having an exemplary thickness of 20 nm.

Figure 4:
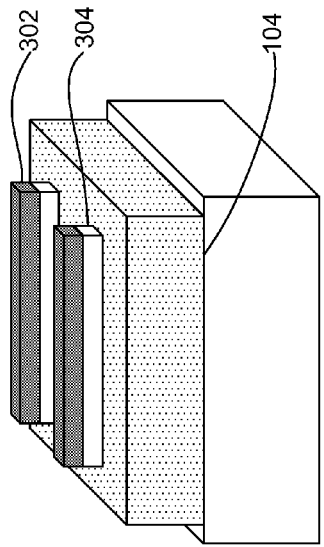
FIG. 4 is a perspective view of a dummy structure formation stage in creating a FinFET having recessed source and drain regions.

Referring now to FIG. 4, a dummy structure 406 is formed. Forming the dummy structure 406 may include, e.g., depositing poly-silicon using a low-pressure chemical vapor deposition (LPCVD). A dummy structure hardmask 408 comprising, e.g., a silicon nitride, may be formed on the poly-silicon. Photolithography and etching, e.g., RIE, may then be employed to pattern the dummy structure 406 and dummy structure hardmask 408. The dummy structure 406 occupies the space that a final gate will occupy, such that the ends of the fin hardmasks 302/304 extend beyond the dummy gate 406.

Figure 5:
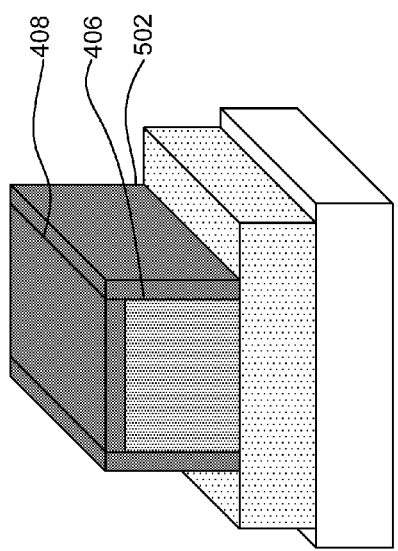
FIG. 5 is a perspective view of a spacer formation stage in creating a fin field effect transistor (FinFET) having recessed source and drain regions.

Referring now to FIG. 5, the excess fin hardmask 302/304 is trimmed and a spacer 502 is added along the sidewalls of the dummy structure 406 and the gate hardmask 408. The ends of fins 302/304 may be removed by, e.g., RIE or other appropriate anisotropic etching or removal process that will preferentially remove material in one direction. The spacer 502 may be formed from the same material as gate hardmask 408, e.g., a silicon nitride.

Figure 6:
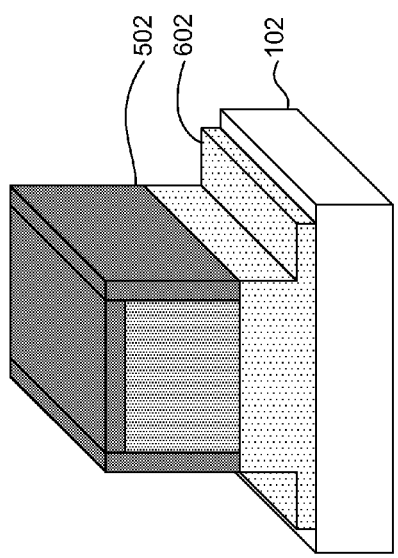
FIG. 6 is a perspective view of a recessed source and drain etching stage in creating a FinFET having recessed source and drain regions.

Referring now to FIG. 6, the semiconductor layer 104 is etched to produce a recessed layer 602. This may be done using a timed RIE, such that a thin layer of semiconductor remains above the dielectric layer 102. The timed RIE should be an anisotropic process that preferentially removes semiconductor material vertically. The recess should be designed to leave a thin layer of silicon in the trench from about 5 nm to about 20 nm thick, and preferably about 5 nm thick. The recessed layer 602 will be used to form recessed source/drain regions. In this way, recessed source and drain regions may be formed from a continuous, single crystal of silicon formed from layer 104. This is distinct from formation processes wherein, for example, multiple crystals might be merged. Such a structure would lack the uniformity of the recessed single-crystalline process shown herein and would introduce crystal imperfections along the border. The recessed layer 602 may then be doped with, e.g. ion implantation to define the source and drain junctions. The dopants may be activated with a high temperature anneal such as a rapid thermal anneal (RTA) or flash anneal up to between 950 C and 1350 C, preferably around 1000 C.

Figure 7:
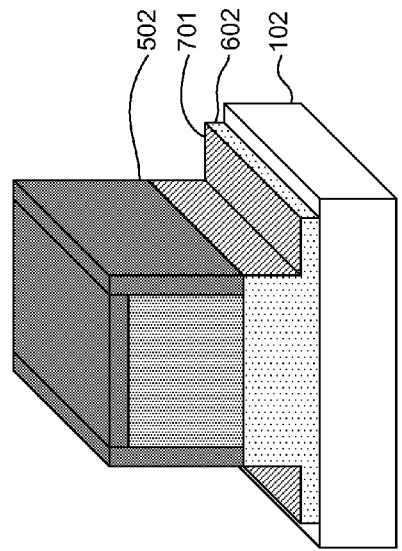
FIG. 7 is a perspective view of a conducting layer formation stage in creating a FinFET having recessed source and drain regions.

Referring now to FIG. 7, a conducting layer 701 is formed on recessed layer 602. The conducting layer may comprise, e.g., a silicide if the semiconductor surface 602 is formed from silicon. Alternatively, any other suitable conducting substance such as a germanicide may be formed instead. Silicide may be formed by depositing a metal layer formed from a transition metal, such as titanium, cobalt, nickel, platinum, or tungsten or from alloys such as NiPt, onto silicon. As such, if the recessed layer 602 is formed from silicon and a layer of, e.g., nickel, is applied, an NiSi phase is formed due to its low resisitivity. The metal layer may have an exemplary thickness from, e.g., about 3 to about 9 nm. Relatively low temperatures, in the exemplary range of about 400 to about 600° C., may be used at this stage. This temperature is highly dependent on the type of metal used. For example, nickel uses a temperature range of about 400 to about 500° C., cobalt uses a temperature of about 600°, and nickel uses temperatures of about 800° C. or more. Annealing times range from about ten seconds to several minutes, depending on the material used and the temperature. This heat causes the metal layer to react with the underlying recessed layer 602 to form a conducting silicide 701. The amount of metal added corresponds to the depth of silicide penetration, and this depth can therefore be tuned accordingly by those skilled in the art. Electrical contact can be made to the conducting regions 701, providing electrical access to the device. To minimize external resistance, the depth of the conducting layer 701 should be tuned such that the underlying recessed layer 602 is not completely consumed. The depth of the conducting layer 701 may be determined by varying the amount of metal deposited. Capping layers and vias for connectivity (not shown) may be formed on the silicide upon completion of the process.

Figure 8:
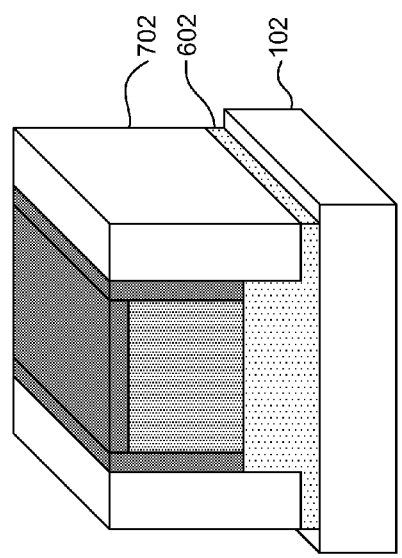
FIG. 8 is a perspective view of a dielectric filling stage in creating a FinFET having recessed source and drain regions.

Referring now to FIG. 8 a dielectric 702 is filled in over the recessed layer 602. For example, silicon dioxide may be used and the dielectric fill 702 may be formed with, e.g., LPCVD. As above, this dielectric may be selected to be any appropriate dielectric substance, but for simplicity may match the dielectric of layer 102 (e.g., silicon dioxide). The top surface of dielectric 702 may be made level with chemical mechanical planarization.

Figure 9:
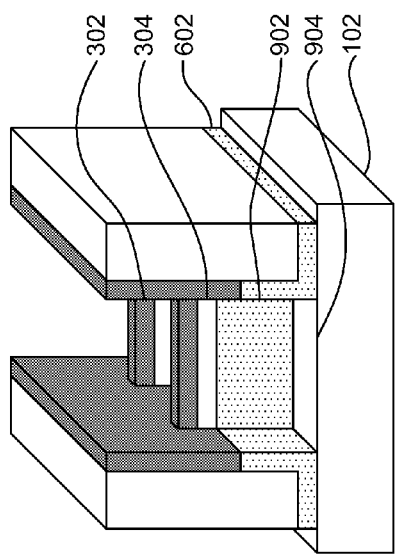
FIG. 9 is a perspective view of a dummy structure removal stage in creating a FinFET having recessed source and drain regions.

Referring now to FIG. 9, the dummy structure 406 and dummy structure hardmask 408 are removed. If poly-silicon was used for the dummy structure 406, the dummy gate may be removed using any appropriate dry or wet removal process. Removing the dummy structure 406 exposes the underlying fin hardmask 302 and oxide layer 304.

Figure 10:
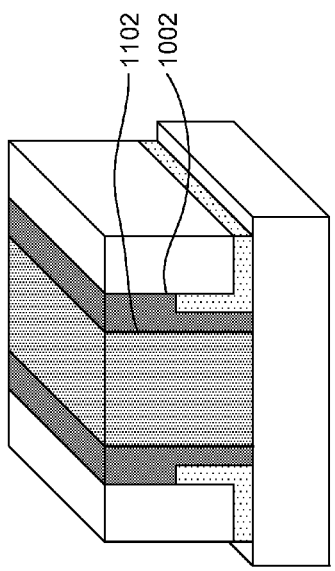
FIG. 10 is a perspective view of a fin etching stage in creating a FinFET having recessed source and drain regions.

Referring now to FIG. 10, semiconductor fins 902 are formed using, e.g., RIE, that removes material from layer 602 but is resisted by fin hardmasks 302/304 and layer 102. An exposed surface 904 of the dielectric layer 102 separates the semiconductor fins 902. The semiconductor fins 902 may optionally be doped with, e.g., germanium, but undoped channels are preferred for depleted devices.

Figure 11:
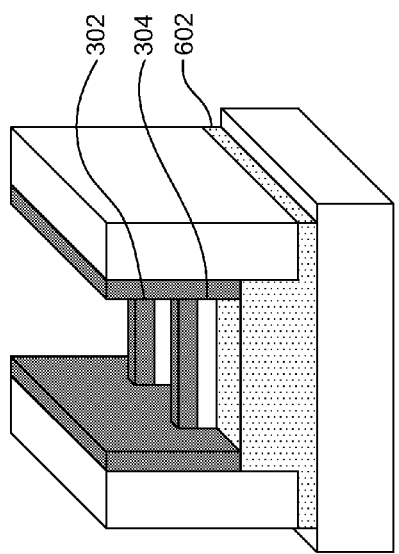
FIG. 11 is a perspective view of a spacer reforming stage in creating a FinFET having recessed source and drain regions.

Referring now to FIG. 11, the spacer 502 is reformed to produce spacer 1002. Additional spacer material is filled in using, e.g., LPCVD. The additional spacer material may be formed from the same material as spacer 502, e.g., silicon nitride. The spacer material is then etched using, e.g., an appropriate RIE, to produce a new spacer 1002 on the gate trench sidewalls with large overetch that can clear the fin sidewalls 902. The new spacer 1002 furthermore covers the sidewall of recessed layer 602. The etch that forms new spacer 1002 uncovers the dielectric layer 304 of the fins 902. Spacer 1002 reduces parasitic capacitance, but is not needed for preventing gate-to-source/drain shorting as would be the case in conventional FinFET process flows.

Figure 12:
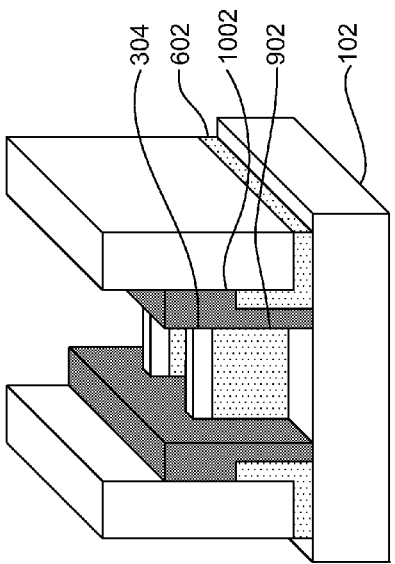
FIG. 12 is a perspective view of a gate formation stage in creating a FinFET having recessed source and drain regions.

Referring now to FIG. 12, gate material 1102 is filled in between the spacers 1002 to complete the device. The gate 1102 may be formed from, e.g., poly-silicon, using LPCVD.

Figure 13:
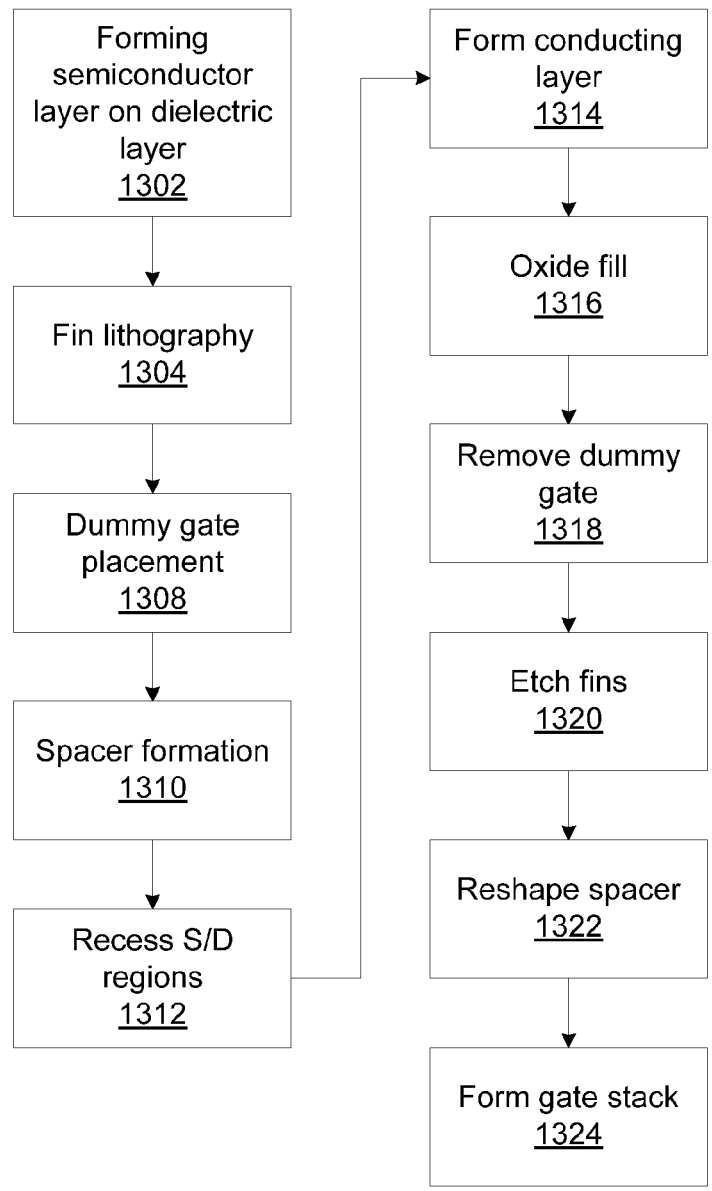
FIG. 13 is a block/flow diagram showing an exemplary process for creating a FinFET having recessed source and drain regions.

Referring now to FIG. 13, an exemplaory process for forming recessed source/drain FinFETs is shown. Block 1302 forms layer 104 on a dielectric layer 102. The layer 104 may be a semiconductor such as silicon and may formed or attached through any suitable process. Block 1304 performs fin lithography, using hardmasks 302 to define the location of fins on the layer 104. A resist such as HSQ may be used to pattern fin locations 204 and an RIE may be used to perform fin lithography 1304.

Block 1308 places a dummy structure 406 formed from, e.g., polysilicon by filling in material using, e.g., LPCVD. The dummy structure 406 may be etched from the bulk material by using a dummy structure hardmask 408. The dummy structure occupies the space that a final gate will occupy. Block 1308 may also include trimming excess fin material outside of the dummy structure. Block 1310 forms a spacer 502 around the dummy structure 406, where the spacer 502 may be formed from a hardmask material such as, e.g., a silicon nitride.

Block 1312 etches layer 104 to form recessed surfaces 602. Block 1312 may perform this etch using a timed RIE process, where the timing allows for selection of the recess depth. Block 1314 forms a conducting 701 on the recessed surfaces and sidewalls 602 that may include, e.g., a silicide to allow for electrical contact with the device. The silicide may be formed by applying a metal layer onto the recessed semiconductor surfaces 602 and performing an anneal.

Block 1316 fills in the space over the conducting layer 701 with an oxide 702, which may be applied using, e.g., LPCVD and which may include any appropriate dielectric such as silicon dioxide. Block 1318 removes the dummy gate using any appropriate dry or wet removal process to expose hardmasks 302.

Block 1320 performs, e.g., RIE to etch out fins 902 from recessed layer 602, stopping on dielectric layer 102 and leaving gaps 904 between fins 902. RIE may be used to free the fins 902 from the recessed layer 602. Block 1322 reforms the spacer 502 to produce spacer 1002, having an overetch to protect the ends of the fins 902 by filling in additional spacer material and then etching away excess material. Block 1324 forms a gate stack 1102 over the fins 902.

Having described preferred embodiments of a system and method for recessed source and drain regions in FinFETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A transistor device comprising:
   at least one fin of channel material connecting a source region and a drain region, wherein the source region and the drain region include a horizontal surface that is recessed with respect to a sidewall of the at least one fin;

a gate conductor formed over the at least one fin; and a spacer formed directly between horizontally adjacent regions of the gate conductor and the source and drain regions.

2. The transistor device of claim 1, wherein the recessed source and drain regions are formed from a single contiguous crystal.

3. The transistor device of claim 1, wherein the horizontal surface comprises a conducting layer.

4. The transistor device of claim 3, wherein the conducting layer is formed from a silicide.

5. The transistor device of claim 1, wherein the source region, drain region, and at least one fin are formed from a single crystal.

6. A transistor device comprising:

at least one fin of channel material connecting a source region and a drain region and parallel to a first vertical plane, terminating at vertical sidewalls that are perpendicular to said at least one fin, wherein the vertical sidewalls are joined to the horizontal surfaces of the source and rain regions, and wherein the source region and the drain region include a horizontal surface that is recessed with respect to a sidewall of the at least one fin;

a gate conductor formed over the at least one fin; and a spacer formed directly between horizontally adjacent regions of the gate conductor and the source and drain regions.

7. The transistor device of claim 6, wherein the recessed source and drain regions are formed from a single contiguous crystal.

8. The transistor device of claim 6, wherein the horizontal surface comprises a conducting layer.

9. The transistor device of claim 8, wherein the conducting layer is formed from a silicide.

10. The transistor device of claim 6, wherein the source region, drain region, and at least one fin are formed from a single crystal.

11. A transistor device, comprising:

at least one fin of channel material connecting a source region and a drain region and meeting a sidewall of said source and drain regions at a right angle, wherein the source and drain region include a horizontal surface that is recessed with respect to a sidewall of the at least one fin; and a gate conductor formed over the at least one fin.

12. The transistor device of claim 11, wherein the recessed source and drain regions are formed from a single contiguous crystal.

13. The transistor device of claim 11, wherein the horizontal surface comprises a conducting layer.

14. The transistor device of claim 13, wherein the conducting layer is formed from a silicide.

15. The transistor device of claim 11, further comprising a liner separating a vertical surface of the source and drain regions from the gate conductor.

16. The transistor device of claim 11, wherein the source region, drain region, and at least one fin are formed from a single crystal.

17. The transistor device of claim 1, wherein the spacer covers only one vertical sidewall of the source and drain regions.

18. The transistor device of claim 1, wherein the spacer covers a horizontal top surface of the source and drain regions.

* * * * *